United States Patent
Qi et al.

(10) Patent No.: US 10,459,336 B2
(45) Date of Patent: Oct. 29, 2019

(54) QUANTUM DOT PHOTORESIST AND MANUFACTURING METHOD THEREOF, DISPLAY SUBSTRATE AND DISPLAY DEVICE

(71) Applicant: BOE Technology Group Co., Ltd., Beijing (CN)

(72) Inventors: Yonglian Qi, Beijing (CN); Bin Zhang, Beijing (CN); Tingting Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 124 days.

(21) Appl. No.: 15/542,339

(22) PCT Filed: Jan. 3, 2017

(86) PCT No.: PCT/CN2017/000037
§ 371 (c)(1),
(2) Date: Jul. 7, 2017

(87) PCT Pub. No.: WO2017/185812
PCT Pub. Date: Nov. 2, 2017

(65) Prior Publication Data
US 2018/0217496 A1    Aug. 2, 2018

(30) Foreign Application Priority Data
Apr. 29, 2016    (CN) .......................... 2016 1 0282658

(51) Int. Cl.
*G03F 7/004*    (2006.01)
*B82Y 20/00*    (2011.01)
(Continued)

(52) U.S. Cl.
CPC ............ *G03F 7/0043* (2013.01); *B82Y 20/00* (2013.01); *G03F 7/0007* (2013.01);
(Continued)

(58) Field of Classification Search
CPC ........ G03F 7/0007; G03F 7/004; G03F 7/028; G03F 7/031; G03F 7/033; G02B 5/201;
(Continued)

(56) References Cited

U.S. PATENT DOCUMENTS

2015/0299501 A1    10/2015    Zhao
2015/0344776 A1    12/2015    Bootman
(Continued)

FOREIGN PATENT DOCUMENTS

CN    103497543 A    1/2014
CN    104516039 A    4/2015
(Continued)

OTHER PUBLICATIONS

Mar. 20, 2017—(WO) International Search Report and Written Opinion Application PCT/CN2017/000037 with English Translation.
(Continued)

*Primary Examiner* — John A McPherson
(74) *Attorney, Agent, or Firm* — Banner & Witcoff, Ltd.

(57) ABSTRACT

A quantum dot photoresist and a manufacturing method thereof, a display substrate and a display device are provided. The manufacturing method of the quantum dot photoresist includes: mixing quantum dots, photodiffusion materials and photoresist mother solution; surface treatment is carried out on the photodiffusion materials or the quantum dots. The quantum dot photoresist prepared by the manufacturing method of the quantum dot photoresist can be applied to the display device, and the photodiffusion materials can refract incident light to the quantum dots, so that light irradiated onto the quantum dots is increased, and thus, a problem of a low utilization rate of the incident light can be solved, and a display effect of the display device can be enhanced.

15 Claims, 3 Drawing Sheets

(51) Int. Cl.
*G03F 7/00* (2006.01)
*G03F 7/033* (2006.01)
*G03F 7/027* (2006.01)
*G02F 1/1335* (2006.01)

(52) U.S. Cl.
CPC ............ *G03F 7/0047* (2013.01); *G03F 7/027* (2013.01); *G03F 7/033* (2013.01); *G02F 1/133617* (2013.01); *G02F 2202/36* (2013.01)

(58) Field of Classification Search
CPC ... G02B 5/206; G02B 5/223; G02F 1/133514; G02F 1/133516; G02F 2202/36; B82Y 20/00
USPC ........................................ 430/7, 270.1, 281.1
See application file for complete search history.

(56) References Cited

U.S. PATENT DOCUMENTS

2016/0178966 A1 6/2016 Li et al.
2017/0115562 A1* 4/2017 Kim ...................... G03F 7/0007

FOREIGN PATENT DOCUMENTS

| CN | 105093830 A | 11/2015 |
| CN | 105446003 A | 3/2016 |
| CN | 105929635 A | 9/2016 |

OTHER PUBLICATIONS

Oct. 9, 2017—(CN) Office Action application CN 201610282658.5 with English Translation.

* cited by examiner

QUANTUM DOT PHOTORESIST AND MANUFACTURING METHOD THEREOF, DISPLAY SUBSTRATE AND DISPLAY DEVICE The application is a U.S. National Phase Entry of International Application No. PCT/CN2017/000037 filed on Jan. 3, 2017, designating the United States of America and claiming priorty to Chinese Patent Application No. 201610282658.5 filed on Apr. 29, 2016. The present application claims priority to and the benefit of the above-identified applications and the above-identified applications are incorporated by reference herein in their entirety.

TECHNICAL FIELD

Embodiments of the present disclosure relate to a quantum dot photoresist and a manufacturing method thereof, a display substrate and a display device.

BACKGROUND

With the development of display technology, display devices are more and more widely used. Display substrates are important components of display devices, and the display substrates have great influence on the display effect of the display devices. The display substrate, for example, may be a base substrate, and the base substrate, for example, comprises a color filter layer and a quantum dot layer formed on the color filter layer.

SUMMARY

At least one embodiment of the present disclosure provides a manufacturing method of a quantum dot photoresist, and the manufacturing method comprises: mixing quantum dots, photodiffusion materials and photoresist mother solution; surface treatment is carried out on the photodiffusion materials or the quantum dots.

For example, in the manufacturing method of the quantum dot photoresist provided in one embodiment of the present disclosure, the quantum dots and the photodiffusion materials are uniformly dispersed in the photoresist mother solution in an ultrasonic manner or a stirring manner.

For example, in the manufacturing method of the quantum dot photoresist provided in one embodiment of the present disclosure, the photodiffusion materials are inorganic nanoparticles.

For example, in the manufacturing method of the quantum dot photoresist provided in one embodiment of the present disclosure, the photodiffusion materials comprise $TiO_2$ nanoparticles or $SiO_2$ nanoparticles.

For example, in the manufacturing method of the quantum dot photoresist provided in one embodiment of the present disclosure, mixing photodiffusion materials and photoresist mother solution comprises mixing the prepared photodiffusion materials with the photoresist mother solution.

For example, in the manufacturing method of the quantum dot photoresist provided in one embodiment of the present disclosure, the photodiffusion materials are $TiO_2$ nanoparticles, after surface modification treatment the $TiO_2$ nanoparticles have lipophilicity.

For example, in the manufacturing method of the quantum dot photoresist provided in one embodiment of the present disclosure, surfaces of the $TiO_2$ nanoparticles are modified by using surfactant, and then the quantum dots, the $TiO_2$ nanoparticles and the photoresist mother solution are mixed.

For example, in the manufacturing method of the quantum dot photoresist provided in one embodiment of the present disclosure, the surfactant is triethanolamine or polyalcohol.

For example, in the manufacturing method of the quantum dot photoresist provided in one embodiment of the present disclosure, —$CH_2CH_2N$ groups in the triethanolamine are bonded onto the surfaces of the $TiO_2$ nanoparticles by oxygen bridges.

For example, in the manufacturing method of the quantum dot photoresist provided in one embodiment of the present disclosure, the photodiffusion materials are $SiO_2$ nanoparticles, and the $SiO_2$ nanoparticles are coated or adsorbed on surfaces of the quantum dots so as to modify the surfaces of the quantum dots.

For example, in the manufacturing method of the quantum dot photoresist provided in one embodiment of the present disclosure, coating or adsorbing the $SiO_2$ nanoparticles on the surfaces of the quantum dots comprises: dissolving the quantum dots in dispersant to obtain quantum dot dispersion solution; mixing tetraethyl orthosilicate, cyclohexane, hexyl alcohol and polyoxyethylene-8-nonylphenyl ether and stirring well to obtain stock solution of the photodiffusion material; mixing the quantum dot dispersion solution and the stock solution of the photodiffusion material, then adding $NH_3 \cdot H_2O$, and stirring or ultrasonic dispersing to form first mixed dispersion solution in which the quantum dots are coated or adsorbed with the photodiffusion material; and adding the first mixed dispersion solution into the photoresist mother solution to form second mixed dispersion solution.

For example, in the manufacturing method of the quantum dot photoresist provided in one embodiment of the present disclosure, the dispersant comprises any one or more of chloroform, tetrahydrofuran, dichloromethane, methylbenzene, normal hexane, methanol, ethanol, propanol, butanol, acetone, dioxane, dimethylformamide and dimethyl sulfoxide.

For example, in the manufacturing method of the quantum dot photoresist provided in one embodiment of the present disclosure, the quantum dots comprise one or more compounds of CdS, CdSe, CdTe, ZnS, ZnSe, ZnTe, HgS, HgTe, GaN, GaAs, InP and InAs.

For example, in the manufacturing method of the quantum dot photoresist provided in one embodiment of the present disclosure, the quantum dots are uniformly mixed type quantum dots, gradient mixed type quantum dots, core-shell type quantum dots or combination type quantum dots.

For example, in the manufacturing method of the quantum dot photoresist provided in one embodiment of the present disclosure, the quantum dots are red CdSe/ZnS type quantum dots or green CdSe/ZnS type quantum dots.

For example, in the manufacturing method of the quantum dot photoresist provided in one embodiment of the present disclosure, the photoresist mother solution comprises adhesive, photoresist monomer, photoinitiator, solvent capable of dissolving the photoresist and active additive.

For example, in the manufacturing method of the quantum dot photoresist provided in one embodiment of the present disclosure, a mass percentage of the photodiffusion material is 5% to 30%, a mass percentage of the quantum dots is 0.05% to 50%, a mass percentage of the adhesive is 20% to 40%, a mass percentage of the photoresist monomer is 1% to 10%, a mass percentage of the photoinitiator is 1% to 3%, a mass percentage of the solvent capable of dissolving the photoresist is 20% to 70%, and a mass percentage of the active additive is 1% to 3%.

For example, in the manufacturing method of the quantum dot photoresist provided in one embodiment of the present disclosure, the adhesive is acrylic resin, the photoresist monomer is acrylic monomer, the photoinitiator is benzophenone photoinitiator, the solvent capable of dissolving the photoresist is propylene glycol methyl ether acetate solvent, and the active additive is silane coupling agent.

At least one embodiment of the present disclosure further provides a quantum dot photoresist, and the quantum dot photoresist comprises photodiffusion materials, quantum dots and photoresist mother solution; the photodiffusion materials or the quantum dots are subjected to surface treatment.

For example, in the quantum dot photoresist provided in one embodiment of the present disclosure, the photodiffusion materials are $TiO_2$ nanoparticles, and after surface modification treatment the $TiO_2$ nanoparticles have lipophilicity.

For example, in the quantum dot photoresist provided in one embodiment of the present disclosure, the photodiffusion materials are $SiO_2$ nanoparticles, and the $SiO_2$ nanoparticles are coated or adsorbed on the surface of the quantum dots.

At least one embodiment of the present disclosure further provides a display substrate, and the display substrate comprises: a base substrate; a color filter layer arranged on the base substrate; and a quantum dot photoresist layer arranged on the color filter layer; the quantum dot photoresist layer comprises any one of the above-mentioned quantum dot photoresist.

At least one embodiment of the present disclosure further provides a display device, and the display device comprises any one of the above-mentioned display substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
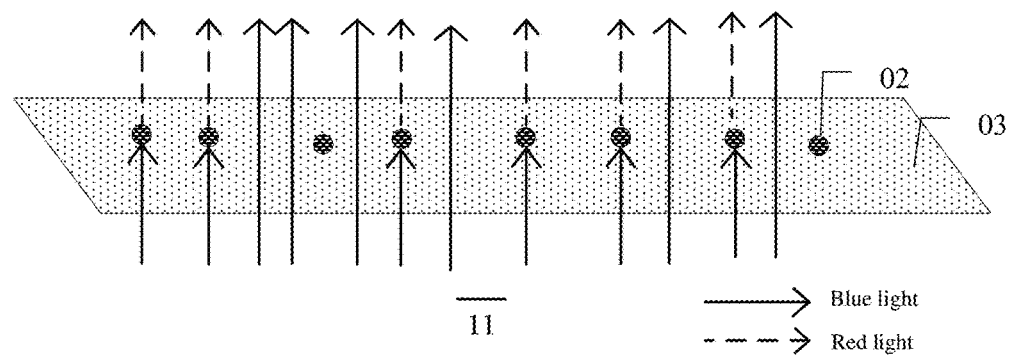
FIG. 1 is a structural schematic diagram of a quantum dot photoresist.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects.

A quantum dot layer in a color filter substrate, for example, is a quantum dot photoresist layer. For example, quantum dots in the quantum dot photoresist layer may comprise red quantum dots and green quantum dots, and the quantum dots of two colors can be excited to generate red light and green light respectively after being irradiated by blue light, so that the quantum dot photoresist layer is configured to display a color image. However, if the quantum dots are unevenly dispersed or large gaps exist among the quantum dots, in a case that blue light irradiates to the gaps among the quantum dots, the blue light will be ejected from a light emergent side of a display substrate without passing through the quantum dots, which results in a waste of incident light and simultaneously results in color mixing, so that the purity of the color of the emergent light is reduced and the utilization rate of the incident light is low.

Photodiffusion materials can be added into the quantum dot photoresist to increase the refraction of the blue light, so that the light irradiated to the red quantum dots and the green quantum dots is increased. The photodiffusion materials generally are inorganic nanoparticles or inorganic microparticles, and thus, the photodiffusion materials are very difficult to disperse in an organic phase and produce agglomeration, so that a problem of low utilization rate of the incident light is occurred.

At least one embodiment of the present disclosure provides a manufacturing method of a quantum dot photoresist, a quantum dot photoresist and a display substrate comprising the quantum dot photoresist and a display device comprising the quantum dot photoresist. The manufacturing method of the quantum dot photoresist comprises: mixing quantum dots, photodiffusion materials and photoresist mother solution; surface treatment is carried out on the photodiffusion materials or the quantum dots.

The quantum dot photoresist prepared by the manufacturing method of the quantum dot photoresist can be applied to a display device, and the photodiffusion materials can refract incident light incident into a display substrate to the quantum dots nearby for example, so that the light irradiated onto the quantum dots is increased, thereby the utilization rate of the incident light is improved and a display effect of the display device is enhanced.

For example, FIG. 1 is a structural schematic diagram of a quantum dot photoresist. After quantum dots 02 particles are added into photoresist mother solution 03, it will cause the problem that blue incident light can not irradiate to the quantum dots and exit directly, which results in a waste of the incident light and simultaneously results in color mixing, besides light emitting efficiency of the red quantum dot photoresist or the green quantum dot photoresist is low.

Figure 2:
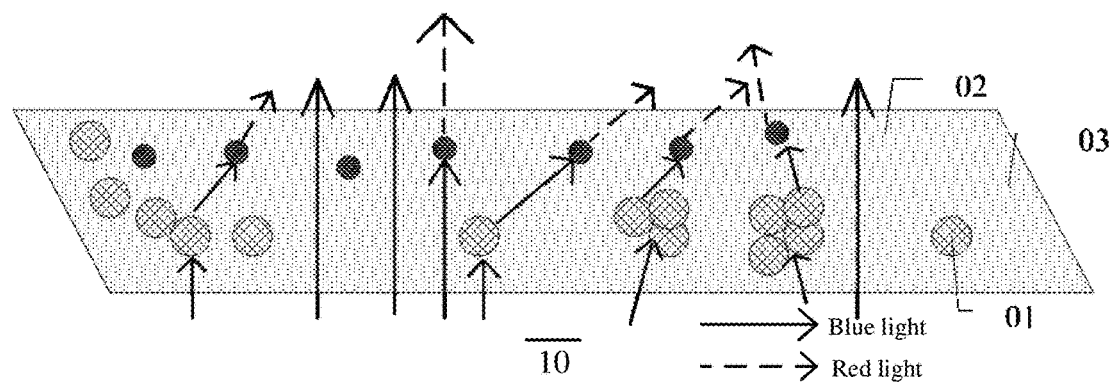
FIG. 2 is a structural schematic diagram of another quantum dot photoresist.

For example, FIG. 2 is a structural schematic diagram of another quantum dot photoresist. After the photodiffusion materials 01 and quantum dots 02 without being treating are directly added into the photoresist mother solution 03, incident light cannot be well refracted due to aggregation of the photodiffusion materials, and similarly, part of the blue incident light cannot irradiate to the quantum dots and exit directly, which results in a waste of the incident light and simultaneously results in color mixing, besides light emitting efficiency of the red quantum dot photoresist or the green quantum dot photoresist is low.

Figure 3:
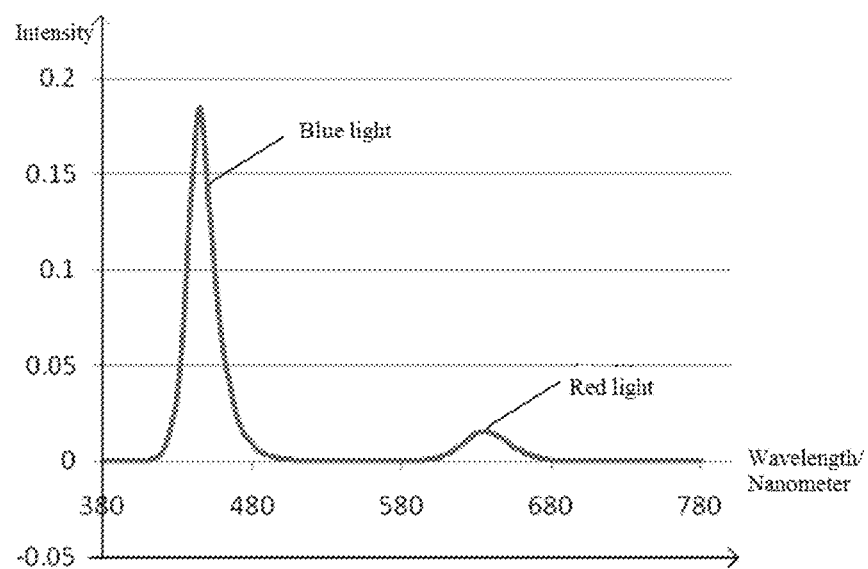
FIG. 3 is a spectrum chart corresponding to the quantum dot photoresist as illustrated in FIG. 1.

For example, FIG. 3 is a spectrum chart corresponding to the quantum dot photoresist as illustrated in FIG. 1. The quantum dot photoresist as illustrated in FIG. 1 has a low utilization rate for the blue light, the intensity of the red emergent light is low, and the intensity of the blue light is also low. For example, it can be seen from FIG. 3, the intensity of the red light emitted from the light emergent side is 0.02 unit intensity, and the intensity of the blue light is 0.18 unit intensity, which illustrates that a lot blue light is wasted.

At least one embodiment of the present disclosure provides a manufacturing method of a quantum dot photoresist, and the manufacturing method comprises: mixing quantum dots, photodiffusion materials and photoresist mother solution, and surface treatment is carried out on the photodiffusion materials or the quantum dots. For example, surface lipophilic treatment is carried out on the photodiffusion materials, and coating or adsorption treatment is carried out on the quantum dots.

For example, the quantum dots and the photodiffusion materials are uniformly dispersed in the photoresist mother solution in an ultrasonic manner or a stirring manner. For example, the stirring manner comprises mechanical stirring, magnetic stirring and the like.

For example, the photodiffusion materials comprise organic photodiffusion materials and inorganic photodiffusion materials. The organic photodiffusion materials can refract and transmit light to change the propagation direction of the light, the organic photodiffusion materials mainly comprise acryl type resin, styrene type resin and the like; and the inorganic photodiffusion materials may refract light to change the propagation direction of the light, the inorganic photodiffusion materials mainly comprise inorganic nanoparticles, for example, nano barium sulfate, nano calcium carbonate, nano silicon dioxide, nano titanium dioxide and the like. For example, the photodiffusion materials used in the embodiment of the present disclosure are inorganic nanoparticles.

For example, the photodiffusion materials used in the embodiment of the present disclosure are titanium dioxide ($TiO_2$) inorganic nanoparticles.

For example, the photodiffusion materials with the ingredient of the $TiO_2$ inorganic nanoparticles are prepared in advance, and then the photodiffusion materials prepared in advance is mixed with the quantum dots and the photoresist mother solution to obtain a mixed material.

Figure 4:
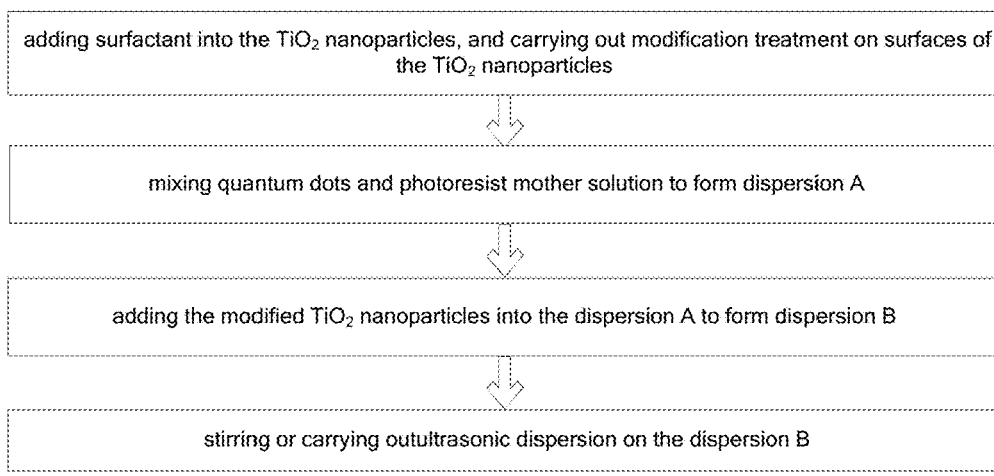
FIG. 4 is a flow chart of a manufacturing method of a quantum dot photoresist provided by an embodiment of the present disclosure.

For example, FIG. 4 is a flow chart of a manufacturing method of a quantum dot photoresist provided by one embodiment of the present disclosure. The photodiffusion materials are $TiO_2$ nanoparticles, the manufacturing method of the quantum dot photoresist comprises the following operations: adding surfactant into the $TiO_2$ nanoparticles, and carrying out modification treatment on surfaces of the $TiO_2$ nanoparticles; mixing quantum dots and photoresist mother solution to form dispersion solution A; adding the modified $TiO_2$ nanoparticles into the dispersion solution A to form dispersion solution B; and then stirring or ultrasonic dispersing the dispersion solution B.

For example, after the $TiO_2$ nanoparticles are synthesized, the $TiO_2$ nanoparticles present strong-polar, and the surfaces of the $TiO_2$ nanoparticles contain hydroxyl, which results the $TiO_2$ nanoparticles having hydrophilic, and the photoresist mother solution is a lipophilic system. In a case that the $TiO_2$ nanoparticles whose surfaces have hydrophilic hydroxyls are added into the lipophilic photoresist mother solution, the $TiO_2$ nanoparticles are aggregated together to cause an aggregation phenomenon due to surface energy so as to influence uniformity of film formation in a case that the quantum dot photoresist is applied to the display substrate, and further uneven light emergence phenomenon is occurred in a case that the color filter substrate is applied to the display device, and the light emitting efficiency is reduced, which causes a poor display effect of a display image. Therefore, by carrying out modification treatment on the surfaces of the $TiO_2$ nanoparticles, the binding capacity of the $TiO_2$ nanoparticles and the photoresist mother solution can be higher than a Van der Waals force among the particles.

For example, a surface modification method comprises: physical coating, chemical coating, precipitation reaction, intercalation modification and the like. In the present example, modification is carried out by utilizing the chemical coating method, a chemical reaction is occurred between the functional groups in organic molecules and the surfaces of the $TiO_2$ nanoparticles, so that the surfaces of the $TiO_2$ nanoparticles are coated and the surfaces of the $TiO_2$ nanoparticles are modified. Polar groups of the surfactant are adsorbed with the strong-polar $TiO_2$ nanoparticles whose surfaces have hydroxyl, non-polar portions of the surfactant are outwards. Due to special space structures and effect of Van der Waals force, coating films are formed on the surfaces of the $TiO_2$ nanoparticles, so that surface tension of the $TiO_2$ nanoparticles is reduced, that is new functional layers are formed on the surfaces of the $TiO_2$ nanoparticles. Carbon chains of the organic molecules having a certain rigidity can prevent mutual approaching of the $TiO_2$ nanoparticles so as to preventing aggregation of the $TiO_2$ nanoparticles, and the dispersion property of $TiO_2$ nanoparticles in oil medium is improved effectively.

For example, the surfactant used for modifying the surfaces of the $TiO_2$ nanoparticles mainly comprises: cationic surfactant, for example, organic amine; nonionic surfactant, for example, polyhydric alcohols and derivatives thereof, ethylene oxide and addition products of various organic hydrophobic groups; organic silicon; insoluble resin; and a lower aliphatic organic compound containing halogen, alcohol, ketone and ether groups.

For example, the surfactant used for modifying the surfaces of the $TiO_2$ nanoparticles may be: triethanolamine or polyalcohol. For example, the surfactant may also be: sodium lauryl sulfate, polyvinylpyrrolidone or sodium stearate and the like. Modification on the surfaces of the $TiO_2$ nanoparticles will be illustrated as follows by taking triethanolamine or polyalcohol for example.

For example, in a case that the triethanolamine ($N(CH_2CH_2OH)_3$) is used as the surfactant, the triethanolamine performs physical adsorption and chemical adsorption on the surfaces of the $TiO_2$ nanoparticles, the triethanolamine has two groups of —OH and —$CH_2CH_2$—, the —$CH_2CH_2$— group in the triethanolamine is exposed outside to be dissolved with an organic phase of the photoresist mother solution, and the —OH group in the triethanolamine reacts with the strong-polar hydroxyl on the surfaces of the $TiO_2$ nanoparticles, so that the tension of the surfaces of the $TiO_2$ nanoparticles is reduced. For example, the reaction mechanism is: $3TiO_2$—OH+$(HOCH_2CH_2)_3$N→ $(TiO_2$—$OCH_2CH_2)_3$N+$3H_2O$. It can be seen that the —$CH_2CH_2$N groups are bonded on the surfaces of the $TiO_2$ nanoparticles by oxygen bridges, so that the $TiO_2$ nanoparticles are dissolved with the organic phase of the photoresist mother solution.

For example, in a case that polyalcohol (for example, propanediol, glycerol, sorbitol and the like) is used as the surfactant. Particularly, taking 1,3-propanediol for example, the 1,3-propanediol has two groups of hydroxyl and —$CH_2CH_2CH_2$— group, the —$CH_2CH_2CH_2$— group in the 1,3-propanediol is exposed outside to be dissolved with the organic phase of the photoresist mother solution, and the —OH group in the 1,3-propanediol reacts with the strong-polar hydroxyl on the surfaces of the $TiO_2$ nanoparticles, so that tension of the surfaces of the $TiO_2$ nanoparticles is reduced. For example, a reaction mechanism of the process is: $2TiO_2$—OH+$HOCH_2CH_2CH_2OH$→$TiO_2$— $OCH_2CH_2CH_2O$—$TiO_2$+$2H_2O$. It can be seen that —$CH_2CH_2CH_2$— group is bonded on the surfaces of the $TiO_2$ nanoparticles by the oxygen bridges, so that the $TiO_2$ nanoparticles are dissolved with the organic phase of the photoresist mother solution.

For example, by using the polyalcohol as the surfactant, the quantum dots can be protected, so that the quantum dots are difficult to quench.

According to the method, by mixing the quantum dots, the $TiO_2$ nanoparticles and the photoresist mother solution and carrying out modification treatment on the surfaces of the $TiO_2$ nanoparticles, the original $TiO_2$ nanoparticles which have hydroxyl and are surface-hydrophilic are modified into the $TiO_2$ particles which are surface-lipophilic, so that the $TiO_2$ nanoparticles reach a certain dispersion effect in the photoresist system. The uniformly dispersed photodiffusion material can improve the utilization rate of the light. For example, one process is that: in a case that the incident light enters the quantum dot photoresist system, the incident light can be refracted onto the quantum dots nearby by the uniformly dispersed photodiffusion material, and then the light irradiated to the quantum dots is increased, so that the utilization rate of the incident light is improved, thereby the display effect of the display device in the subsequent application is enhanced.

Figure 5:
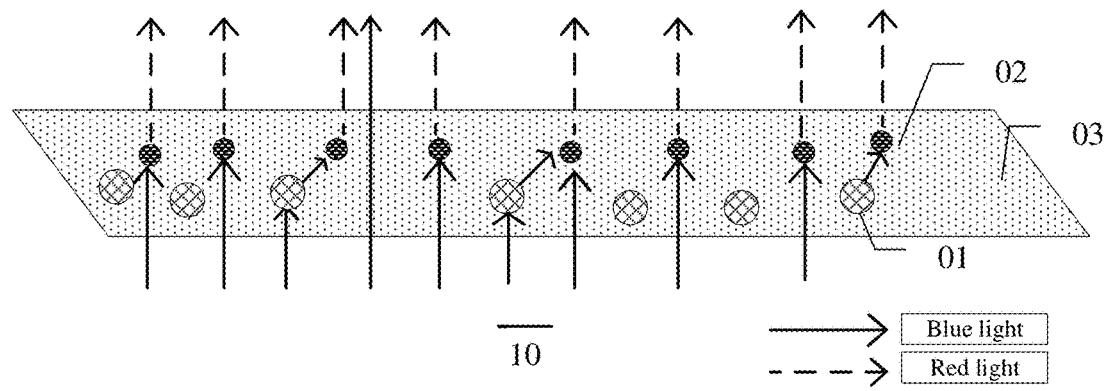
FIG. 5 is a structural schematic diagram of a quantum dot photoresist provided by an embodiment of the present disclosure.

For example, FIG. 5 is a structural schematic diagram of a quantum dot photoresist prepared by the manufacturing method of the quantum dot photoresist provided in FIG. 4. It can be seen from FIG. 5, the photodiffusion materials 01 and the quantum dots 02 are uniformly dispersed in the photoresist mother solution 03, and in a case that the incident light enters the quantum dot photoresist system, the incident light can be refracted onto the quantum dots by the uniformly dispersed photodiffusion material, so that the light irradiated to the quantum dots is increased, and the utilization rate of the incident light is improved.

Figure 6:
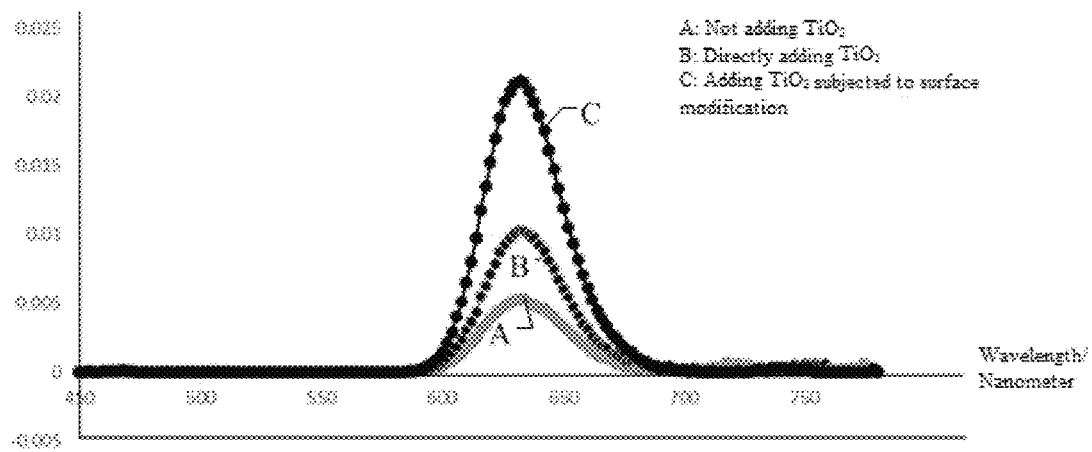
FIG. 6 is a spectrum chart corresponding to the quantum dot photoresist as illustrated in FIG. 5.

For example, FIG. 6 is a spectrum chart corresponding to the quantum dot photoresist as illustrated in FIG. 5, and the spectrum chart illustrated in FIG. 6 also provides a comparison of the spectra of the quantum dot photoresist formed without adding $TiO_2$ nanoparticles and $TiO_2$ nanoparticles are directly added into the photoresist mother solution without surface treatment. The spectrum chart as illustrated in FIG. 6 is a light intensity comparison diagram that blue light is the incident light and red light is excited, and it can be seen from FIG. 6, the intensity of the red light emerging from the quantum dot photoresist which is not added with the $TiO_2$ nanoparticles is the lowest and is 0.0051 unit intensity; the intensity of the red light emerging from the quantum dot photoresist formed by $TiO_2$ nanoparticles directly added into the photoresist mother solution without surface treatment is second and is 0.011 unit intensity; and the intensity of the red light emerging from the quantum dot photoresist formed by adding the $TiO_2$ nanoparticles into the photoresist mother solution after carrying out surface modification on the $TiO_2$ nanoparticles is the highest and is 0.022 unit intensity. It illustrates that after the $TiO_2$ nanoparticles are subjected to surface modification, the utilization rate of the incident light can be obviously enhanced.

In at least one embodiment of the present disclosure, for example, the quantum dots comprise one or more compounds selected from the group consisting of cadmium sulfide (CdS), cadmium selenide (CdSe), cadmium telluride (CdTe), zinc sulfide (ZnS), zinc selenide (ZnSe), zinc telluride (ZnTe), mercuric sulfide (HgS), cadmium telluride (HgTe), gallium nitride (GaN), gallium arsenide (GaAs), indium phosphide (InP) and indium arsenide (InAs).

For example, the quantum dots may be uniformly mixed type quantum dots, gradient mixed type quantum dots, core-shell type quantum dots or combination type quantum dots. That is, the quantum dots may be uniformly mixed quantum dots, concentration gradient mixed quantum dots, coated type core-shell structure composed of some of the quantum dots, and uniformly dispersed structure formed by the combination of the quantum dots.

For example, the quantum dots are red CdSe/ZnS type quantum dots or green CdSe/ZnS type quantum dots. The red quantum dots can emit red light under the excitation of blue light, and the green quantum dots can emit green light under the excitation of blue light. The quantum dot photoresist is composed of the quantum dots emitting different colors, the corresponding quantum dots can be selected according to different colors, and for example, in a case that red light needs to be emitted, the red CdSe/ZnS type quantum dots is selected; and in a case that the green light needs to be emitted, the green CdSe/ZnS type quantum dots is selected. As long as light of different colors can be emitted as required, the type of the selected quantum dots is not limited in the embodiment of the present disclosure.

For example, the photoresist mother solution comprises adhesive, photoresist monomer, photoinitiator, solvent capable of dissolving the photoresist and active additive.

For example, a mass percentage of the photodiffusion material is 5% to 30%, a mass percentage of the quantum dots is 0.05% to 50%, a mass percentage of the adhesive is 20% to 40%, a mass percentage of the photoresist monomer is 1% to 10%, a mass percentage of the photoinitiator is 1% to 3%, a mass percentage of the solvent capable of dissolving the photoresist is 20% to 70%, and a mass percentage of the active additive is 1% to 3%.

For example, in the quantum dot photoresist, the mass percentage of the photodiffusion material is 10% to 20%. In a case that the mass percentage of the photodiffusion material is 10% to 20%, the utilization rate of the quantum dot photoresist for the light is high, and the exposure of the quantum dot photoresist is good, and in a case that the quantum dot photoresist is exposed, phenomena of exposure incompleteness and residues of the quantum dot photoresist can not be generated.

For example, more particularly, the mass percentage of the photodiffusion material is 10%, the mass percentage of the quantum dots is 10%, the mass percentage of the adhesive is 30%, the mass percentage of the photoresist monomer is 5%, the mass percentage of the photoinitiator is 2%, the mass percentage of the solvent capable of dissolving the photoresist is 40%, and the mass percentage of the active additive is 3%.

It should be noted that, the quantum dot photoresists including quantum dots of different colors correspond to the photodiffusion materials with different mass percentages. The red quantum dots have high conversion efficiency for the blue light, so that in the quantum dot photoresist including the red quantum dots, the mass percentage of the photodiffusion material is low, for example, the mass percentage of the photodiffusion material is 10%; the green quantum dots have low conversion efficiency for the blue light, so that in the quantum dot photoresist including the green quantum dots, the mass percentage of the photodiffusion material is high, for example, the mass percentage of the photodiffusion material is 25%.

It should be noted that, the incident light may be blue light. In a case that the blue light is irradiated onto the red quantum dots, the red quantum dots are excited by the blue light to emit red light, and the red light is emitted from a light emergent side of the quantum dot photoresist. In a case that the blue light irradiates onto the green quantum dots, the green quantum dots are excited by the blue light to emit the green light, and the green light is emitted from the light emergent side of the quantum dot photoresist. In a case that the blue light irradiates to the photodiffusion material, the photodiffusion material can refract the blue light, and after the blue light is refracted, one part of blue light is refracted onto the quantum dots, and the other part of blue light which is not refracted onto the quantum dots is emitted from the light emergent side of the quantum dot photoresist.

The incident light may also be white light, and the white light is a set of light of various colors, and the white light comprises blue light ingredient. In a case that the white light irradiates onto the red quantum dots, the red quantum dots are excited by the blue light ingredient in the white light to emit red light, and the red light is emitted from the light emergent side of the quantum dot photoresist; in a case that the white light irradiates onto the green quantum dots, the green quantum dots are excited by the blue light ingredient in the white light to emit green light, and the green light is emitted from the light emergent side of the quantum dot photoresist; and in a case that the white light irradiates to the photodiffusion material, the photodiffusion material can refract the white light, and after the white light is being refracted, one part of white light is refracted onto the quantum dots, and the other part of white light which is not refracted onto the quantum dots is emitted from the light emergent side of the quantum dot photoresist.

For example, the adhesive is acrylic resin, the photoresist monomer is acrylic monomer, the photoinitiator is benzophenone type photoinitiator, the solvent capable of dissolving the photoresist is propylene glycol methyl ether acetate (PGMEA) solvent, and the active additive is silane coupling agent.

For example, the photodiffusion material used in the embodiment of the present disclosure is silicon dioxide ($SiO_2$) inorganic nanoparticles.

For example, the photodiffusion material with an ingredient of silicon dioxide ($SiO_2$) uses the quantum dots as seeds, and $SiO_2$ inorganic nanoparticles are synthesized on the surface of quantum dots in a seed growing mode to form a structure that the quantum dots are coated or adsorbed with the $SiO_2$ inorganic nanoparticles so as to modifying the surface of the quantum dots. Then, the quantum dots coated or adsorbed with the $SiO_2$ inorganic nanoparticles are mixed with the photoresist mother solution.

Figure 7:
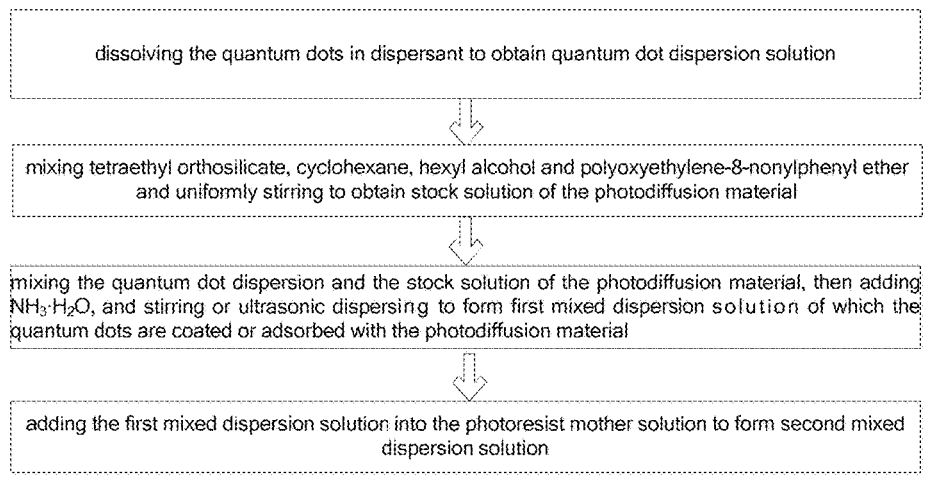
FIG. 7 is a flow chart of another manufacturing method of a quantum dot photoresist provided by an embodiment of the present disclosure.

For example, FIG. 7 is a flow chart of another manufacturing method of a quantum dot photoresist provided by one embodiment of the present disclosure. The photodiffusion material is $SiO_2$. The manufacturing method of the quantum dot photoresist, for example is a solution method, and the method comprises: dispersing quantum dots into dispersant to obtain quantum dot dispersion; mixing tetraethyl orthosilicate, cyclohexane, hexyl alcohol and polyoxyethylene-8-nonylphenyl ether and uniformly stirring to obtain stock solution of the photodiffusion material; mixing the quantum dot dispersion and the stock solution of the photodiffusion material, then adding $NH_3.H_2O$, and stirring or ultrasonic dispersing to form first mixed dispersion solution in which the quantum dots are coated or adsorbed with the photodiffusion material; and adding the first mixed dispersion solution into the photoresist mother solution to form second mixed dispersion.

For example, a specific example comprises: dispersing 2.5 g quantum dots into 200 ml chloroform, ultrasonic dispersing, and enabling chloroform solution in which the quantum dots are dispersed to become clear dispersion, that is, forming quantum dot dispersion; mixing tetraethyl orthosilicate, that is 120 ul TEOS, 15 ml cyclohexane, 30 ml hexyl alcohol and 3.5 ml polyoxyethylene-8-nonylphenyl ether and stirring for four hours at the room temperature to form the stock solution of the photodiffusion material; adding the prepared stock solution of the photodiffusion material into the quantum dot dispersion which is dispersed, and uniformly stirring; then adding 100 ml $NH_3.H_2O$ into the above system to continuously stir to form uniform solution, continuously stirring for 24 hours without light to form the structure of which the quantum dots are coated or adsorbed with the $SiO_2$ inorganic nanoparticles so as to carry out modification on the surfaces of the quantum dots; and then mixing the quantum dots coated or adsorbed with the $SiO_2$ inorganic nanoparticles and the photoresist mother solution to form the quantum dot photoresist dispersion.

Besides the chloroform, the dispersant for dissolving the quantum dots may also be tetrahydrofuran, dichloromethane, methylbenzene, normal hexane, methanol, ethanol, propanol, butanol, acetone, dioxane, dimethylformamide, dimethyl sulfoxide and the like. The dispersant may be one of the above dispersants, and may also be a mixture of the several dispersants described above.

The quantum dot photoresist prepared in the method, the photodiffusion material $SiO_2$ can coat or adsorb the quantum dots, so that not only the stability of the quantum dots can be improved and quenching of the quantum dots in an organic photoresist can be avoided, but also the photodiffusion material $SiO_2$ can be effectively used to refract the light, and the utilization rate of the light is improved. The incident light can be repeatedly used in a case that the incident light enters the quantum dot photoresist system, and the incident light can be effectively utilized for many times through the action of the light diffusion material, and the utilization rate of the incident light can be obviously improved.

Figure 8:
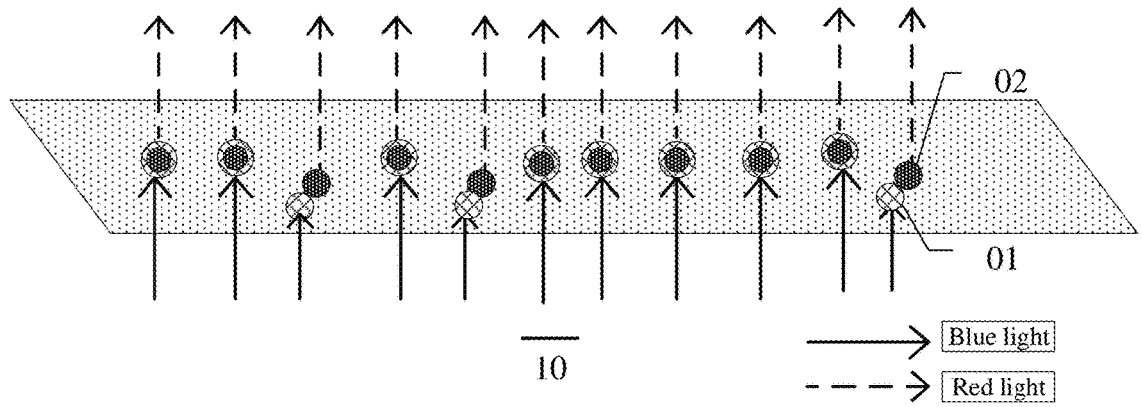
FIG. 8 is a structural schematic diagram of a quantum dot photoresist provided by an embodiment of the present disclosure.

FIG. 8 is a structural schematic diagram of a quantum dot photoresist prepared by the manufacturing method of the quantum dot photoresist provided by an embodiment of the present disclosure. A structure and ingredient of quantum dots, composition ingredients of photoresist mother solution and content of each component can refer to the above descriptions, and detailed descriptions will be omitted here.

Figure 9:
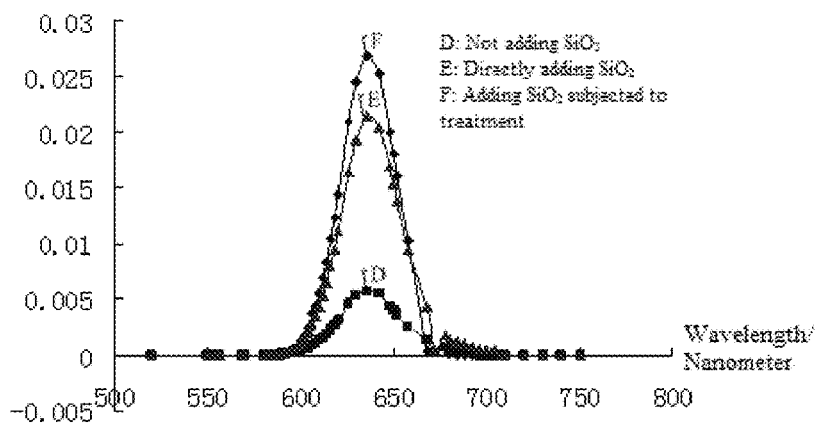
FIG. 9 is a spectrum chart corresponding to the quantum dot photoresist as illustrated in FIG. 8.

For example, FIG. 9 is a spectrum chart corresponding to the quantum dot photoresist as illustrated in FIG. 8, and the spectrum chart illustrated in FIG. 9 also provides a comparison of the spectra of the quantum dot photoresist formed without adding $SiO_2$ nanoparticles and $SiO_2$ nanoparticles are directly added into the photoresist mother solution without forming a coating structure of a absorbing structure with the quantum dots. The spectrum chart as illustrated in FIG. 9 is a light intensity comparison diagram that blue light is the incident light and red light is excited, and it can be seen from FIG. 9, the intensity of the red light emerging from the quantum dot photoresist which is not added with the $SiO_2$ nanoparticles is the lowest and is 0.0062 unit intensity; the intensity of the red light emerging from the quantum dot photoresist formed by $SiO_2$ nanoparticles directly added into the photoresist mother solution is second and is 0.022 unit intensity; and the intensity of the red light emerging from the quantum dot photoresist formed by adding a coating structure or a absorbing structure of the $SiO_2$ nanoparticles and the quantum dots into the photoresist mother solution is the highest and is 0.027 unit intensity. It illustrates that after the $SiO_2$ and the quantum dots form the coating or adsorption structure, the utilization rate of the incident light can be obviously enhanced.

At least one embodiment of the present disclosure further provides a quantum dot photoresist. The quantum dot photoresist comprises: photodiffusion materials, quantum dots and photoresist mother solution, and the photodiffusion materials or the quantum dots are subjected to surface treatment.

For example, the photodiffusion materials are $TiO_2$ nanoparticle subjected to surface modification treatment, and the $TiO_2$ nanoparticles have lipophilicity. Modification treatment on the surfaces of the $TiO_2$ nanoparticles, the original $TiO_2$ nanoparticles which have hydroxyl and are surface-hydrophilic are modified into the $TiO_2$ particles which are surface-lipophilic, so that the $TiO_2$ nanoparticles reach a certain dispersion effect in the photoresist system. The uniformly dispersed photodiffusion material can improve the utilization rate of the light. For example, one process is that: in a case that the incident light enters the quantum dot photoresist system, the incident light can be refracted onto the quantum dots nearby by the uniformly dispersed photodiffusion material, and then the light irradiated to the quantum dots is increased, so that the utilization rate of the incident light is improved, thereby the display effect of the display device in the subsequent application is enhanced.

For example, the photodiffusion materials are $SiO_2$ nanoparticles, the $SiO_2$ nanoparticles are coated or adsorbed on the surfaces of the quantum dots to modification the surfaces of the quantum dots. For the quantum dot photoresist modified by the method, not only the stability of the quantum dots can be improved and quenching of the quantum dots in an organic photoresist can be avoided, but also the photodiffusion materials $SiO_2$ can be effectively used to refract the light, and the utilization rate of the light is improved. The incident light can be repeatedly used in a case that the incident light enters the quantum dot photoresist system, and the incident light can be effectively utilized for many times through the action of the light diffusion material, and the utilization rate of the incident light can be obviously improved.

At least one embodiment of the present disclosure further provides a display substrate. The display substrate comprises: a base substrate; a color filter layer arranged on the base substrate; and a quantum dot photoresist layer arranged on the color filter layer, and the quantum dot photoresist layer is any one of the above quantum dot photoresists.

At least one embodiment of the present disclosure further provides a display device, and the display device comprises any one of the above display substrate. The display device can be: a liquid crystal display panel, an electronic paper, an organic light-emitting diode panel (short for OLED), a mobile phone, a tablet computer, a television, a display, a notebook computer, a digital picture frame, a navigation system and any other product or component having a display function.

At least one embodiment of the present disclosure provides a quantum dot photoresist and a manufacturing method thereof, a display substrate and a display device. The quantum dot photoresist prepared by the manufacturing method can be applied to the display device, and the photodiffusion materials can refract the incident light to the quantum dots, so that light irradiated onto the quantum dots is increased, and thus, the utilization rate of the incident light is improved, and a display effect of the display device is enhanced.

The following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is amplified or reduced, that is, these drawings are not drawn according to an actual scale.

(3) In the absence of conflict, the embodiments of the present disclosure and the features in the embodiments can be combined with each other to obtain new embodiments.

What are described above is related to the illustrative embodiments of the disclosure only and not limitative to the scope of the disclosure. Therefore, the scopes of the disclosure are defined by the accompanying claims.

The application claims priority of Chinese Patent Application No. 201610282658.5 filed on Apr. 29, 2016, the disclosure of which is incorporated herein by reference in its entirety as part of the present application.

What is claimed is:

1. A manufacturing method of a quantum dot photoresist, comprising:
   mixing quantum dots, photodiffusion materials and a photoresist mother solution, wherein surface treatment is carried out on the quantum dots; the photodiffusion materials are $SiO_2$ nanoparticles; and
   coating or adsorbing the $SiO_2$ nanoparticles on surfaces of the quantum dots, which comprises:
   dissolving the quantum dots in dispersant to obtain quantum dot dispersion solution;
   mixing tetraethyl orthosilicate, cyclohexane, hexyl alcohol and polyoxyethylene-8-nonylphenyl ether, and stirring well to obtain stock solution of the photodiffusion material;

mixing the quantum dot dispersion solution and the stock solution of the photodiffusion material, then adding $NH_3 \cdot H_2O$, and stirring or ultrasonic dispersing to form first mixed dispersion solution in which the quantum dots are coated or adsorbed with the photodiffusion material; and adding the first mixed dispersion solution into the photoresist mother solution to form second mixed dispersion solution.

2. The manufacturing method of the quantum dot photoresist according to claim 1, wherein the quantum dots and the photodiffusion materials are uniformly dispersed in the photoresist mother solution in an ultrasonic manner or a stirring manner.

3. The manufacturing method of the quantum dot photoresist according to claim 1, wherein mixing photodiffusion materials and photoresist mother solution comprises: mixing prepared photodiffusion materials with the photoresist mother solution.

4. The manufacturing method of the quantum dot photoresist according to claim 3, wherein the $SiO_2$ nanoparticles are coated or adsorbed on surfaces of the quantum dots so as to modify the surfaces of the quantum dots.

5. The manufacturing method of the quantum dot photoresist according to claim 1, wherein the quantum dots are uniformly mixed type quantum dots, gradient mixed type quantum dots, core-shell type quantum dots or combination type quantum dots.

6. A manufacturing method of a quantum dot photoresist, comprising:
   subjecting photodiffusion materials which are $TiO_2$ nanoparticles to surface treatment; and
   mixing quantum dots, the photodiffusion materials and a photoresist mother solution;
   wherein after the surface treatment the $TiO_2$ nanoparticles have lipophilicity.

7. The manufacturing method of the quantum dot photoresist according to claim 6, wherein surfaces of the $TiO_2$ nanoparticles are modified by using surfactant, and then the quantum dots, the $TiO_2$ nanoparticles and the photoresist mother solution are mixed.

8. The manufacturing method of the quantum dot photoresist according to claim 7, wherein the surfactant is triethanolamine or polyalcohol.

9. The manufacturing method of the quantum dot photoresist according to claim 8, wherein —$CH_2CH_2N$ groups in the triethanolamine are bonded onto the surfaces of the $TiO_2$ nanoparticles by oxygen bridges.

10. The manufacturing method of the quantum dot photoresist according to claim 6, wherein the photoresist mother solution comprises adhesive, photoresist monomer, photoinitiator, solvent capable of dissolving the photoresist, and active additive.

11. The manufacturing method of the quantum dot photoresist according to claim 10, wherein a mass percentage of the photodiffusion material is 5% to 30%, a mass percentage of the quantum dots is 0.05% to 50%, a mass percentage of the adhesive is 20% to 40%, a mass percentage of the photoresist monomer is 1% to 10%, a mass percentage of the photoinitiator is 1% to 3%, a mass percentage of the solvent capable of dissolving the photoresist is 20% to 70%, and a mass percentage of the active additive is 1% to 3%.

12. The manufacturing method of the quantum dot photoresist according to claim 10, wherein the adhesive is acrylic resin, the photoresist monomer is acrylic monomer, the photoinitiator is benzophenone photoinitiator, the solvent capable of dissolving the photoresist is propylene glycol methyl ether acetate solvent, and the active additive is silane coupling agent.

13. A quantum dot photoresist, comprising photodiffusion materials, quantum dots and a photoresist mother solution,
   wherein the quantum dots are subjected to surface treatment, the photodiffusion materials are $SiO_2$ nanoparticles, and the $SiO_2$ nanoparticles are coated or adsorbed on surfaces of the quantum dots, and coating or adsorbing the $SiO_2$ nanoparticles on surfaces of the quantum dots comprises:
   dissolving the quantum dots in dispersant to obtain quantum dot dispersion solution;
   mixing tetraethyl orthosilicate, cyclohexane, hexyl alcohol and polyoxyethylene-8-nonylphenyl ether, and stirring well to obtain stock solution of the photodiffusion material;
   mixing the quantum dot dispersion solution and the stock solution of the photodiffusion material, then adding $NH_3 \cdot H_2O$, and stirring or ultrasonic dispersing to form first mixed dispersion solution in which the quantum dots are coated or adsorbed with the photodiffusion material; and
   adding the first mixed dispersion solution into the photoresist mother solution to form second mixed dispersion solution; or
   wherein the photodiffusion materials are $TiO_2$ nanoparticles, which are subjected to surface treatment, and after the surface treatment the $TiO_2$ nanoparticles have lipophilicity.

14. A display substrate, comprising:
   a base substrate;
   a color filter layer arranged on the base substrate; and
   a quantum dot photoresist layer arranged on the color filter layer, wherein the quantum dot photoresist layer comprises the quantum dot photoresist according to claim 13.

15. A display device, comprising the display substrate according to claim 14.

\* \* \* \* \*